United States Patent
Han et al.

(10) Patent No.: US 11,342,539 B2
(45) Date of Patent: May 24, 2022

(54) DISPLAY PANEL ALIGNED WITH WINDOW AND DISPLAY DEVICE HAVING THE SAME

(71) Applicant: Samsung Display Co., Ltd., Yongin (KR)

(72) Inventors: Seoin Han, Cheonan-si (KR); Bonjoo Koo, Cheonan-si (KR); Namseok Baik, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/796,274

(22) Filed: Feb. 20, 2020

(65) Prior Publication Data
US 2020/0274105 A1    Aug. 27, 2020

(30) Foreign Application Priority Data

Feb. 21, 2019    (KR) .................... 10-2019-0020410

(51) Int. Cl.
*H01L 51/52* (2006.01)
*H01L 27/32* (2006.01)
*H01L 51/00* (2006.01)

(52) U.S. Cl.
CPC ........ *H01L 51/5281* (2013.01); *H01L 27/323* (2013.01); *H01L 27/3244* (2013.01); *H01L 51/0097* (2013.01); *H01L 51/524* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 6,653,210 B2 | 11/2003 | Choo et al. | |
| 9,373,811 B2 | 6/2016 | Go | |
| 9,978,997 B2 | 5/2018 | Kwon et al. | |
| 10,163,987 B2* | 12/2018 | Odaka | H01L 51/524 |
| 2011/0109535 A1* | 5/2011 | Watanabe | G02F 1/133526 |
| | | | 345/87 |

(Continued)

FOREIGN PATENT DOCUMENTS

| KR | 1020140055608 A | 5/2014 |
|---|---|---|
| KR | 1020150043605 A | 4/2015 |
| KR | 1020170140491 A | 12/2017 |

OTHER PUBLICATIONS

Definition of align downloaded from URL< https://www.merriam-webster.com/dictionary/align> on Mar. 17, 2021. (Year: 2021).*

*Primary Examiner* — J. E. Schoenholtz
(74) *Attorney, Agent, or Firm* — Cantor Colburn LLP

(57) ABSTRACT

A display device includes a window; a display panel including: a flat portion corresponding to the display area, and a bending portion extending from the flat portion and at which the display panel is bendable; a circuit substrate connected to the display panel at the bending portion; and a protection film disposed facing the window with the display panel therebetween. The window and the display panel each include a first side surface corresponding to the bending portion, and remaining side surfaces except for the first side surface, and the remaining side surfaces of the window and the display panel are respectively aligned with each other to define a total planar area of the window being equal to a total planar area of the flat portion.

20 Claims, 11 Drawing Sheets

(56) References Cited

U.S. PATENT DOCUMENTS

| | | | |
|---|---|---|---|
| 2015/0049428 A1* | 2/2015 | Lee | G06F 1/1652 |
| | | | 361/679.27 |
| 2017/0148859 A1* | 5/2017 | Nishinohara | H01L 51/524 |
| 2017/0358781 A1 | 12/2017 | Kang et al. | |
| 2018/0108714 A1* | 4/2018 | Odaka | G06F 1/1637 |
| 2018/0182829 A1* | 6/2018 | Shin | H01L 51/56 |
| 2018/0217640 A1* | 8/2018 | Nishikawa | H01L 51/524 |
| 2018/0366662 A1* | 12/2018 | Sano | B32B 9/045 |
| 2019/0355927 A1* | 11/2019 | Park | H01L 51/5246 |
| 2020/0083310 A1* | 3/2020 | Xu | H01L 27/1218 |
| 2020/0152895 A1* | 5/2020 | Zhu | H01L 51/0097 |
| 2021/0183840 A1* | 6/2021 | Wang | H01L 27/3276 |

\* cited by examiner

DISPLAY PANEL ALIGNED WITH WINDOW AND DISPLAY DEVICE HAVING THE SAME

This application claims priority to Korean Patent Application No. 10-2019-0020410, filed on Feb. 21, 2019, and all the benefits accruing therefrom under 35 U.S.C. § 119, the entire contents of which are hereby incorporated by reference.

BACKGROUND

(1) Field

The present disclosure relates to a display device, and in particular, to a display device with improved visibility.

(2) Description of the Related Art

A display device includes an organic light emitting display ("OLED"), a liquid crystal display ("LCD"), an electrophoretic display ("ED"), a surface-conduction electron-emitter display ("SED"), a vacuum fluorescent display panel ("VFD"), and so forth.

The display device includes a display region at which an image is displayed and a non-display region adjacent to the display region. Demand is increasing for a display device with an enlarged display region and a reduced non-display region.

SUMMARY

One or more embodiment of the invention provides a display device with an enlarged display region.

According to an embodiment of the invention, a display device includes a window; a display panel disposed below the window and including: a flat portion corresponding to the display area, and a bending portion extending from the flat portion and at which the display panel is bendable; a circuit substrate connected to the display panel at the bending portion; and a protection film disposed facing the window with the display panel therebetween. The window and the display panel each include a first side surface corresponding to the bending portion, and remaining side surfaces except for the first side surface, and the remaining side surfaces of the window and the display panel are respectively aligned with each other to define a total planar area of the window being equal to a total planar area of the flat portion.

In an embodiment, the display device may further include a polarization layer between the window and the display panel, and a total planar area of the polarization layer may be equal to the total planar area of the window and the total planar area of the flat portion.

In an embodiment, the polarization layer may include a first side surface corresponding to the bending portion and to the first side surface of each of the window and the display panel, and remaining side surfaces except for the first side surface of the polarization layer, and the remaining side surfaces of the window and the polarization layer may be respectively aligned with each other.

In an embodiment, each of the remaining side surfaces of the window and the display panel which are respectively aligned with each other may be parallel to a thickness direction of the display panel.

In an embodiment, the protection film may be disconnected at the bending portion, and the protection film may include a first protection portion corresponding to the flat portion, and a second protection portion which is spaced apart from the first protection portion and corresponds to the bending portion.

In an embodiment, the first protection portion may include a first side surface corresponding to the bending portion and to the first side surface of each of the window and the display panel, and remaining side surfaces except for the first side surface of the first protection portion, and the remaining side surfaces of the first protection portion and the display panel may be respectively aligned with each other.

In an embodiment, the bending portion may include a first portion at which the first side surface of the display panel is defined and a second portion which connects the flat portion to the first portion, and the first portion overlaps the flat portion and the second portion which is bent does not overlap the flat portion.

In an embodiment, a top surface of the window may include carbide along each of the first side surface of the window and the remaining side surfaces of the window.

In an embodiment, the window may include a first window portion disposed on the display panel, a second window portion disposed on the first window portion, and an adhesive layer disposed between the first and second window portions.

According to an embodiment of the invention, a display device includes a display panel including: a display area at which an image is displayed, a flat portion corresponding to the display area, and a bending portion extending from the flat portion and at which the display panel is bendable; a window through which the image from the display panel is viewable from outside the display device; and a protection film disposed facing the window with the display panel therebetween. The window and the display panel each include a first side surface corresponding to the bending portion, and remaining side surfaces except for the first side surface, and the remaining side surfaces of the window and the display panel are respectively aligned with each other.

In an embodiment, the display device may further include a polarization layer disposed between the window and the display panel, the polarization layer may include a first side surface corresponding to the bending portion and to the first side surface of each of the window and the display panel, and remaining side surfaces except for the first side surface of the polarization layer, and the remaining side surfaces of the window and the polarization layer may be respectively aligned with each other.

In an embodiment, a total planar area of the polarization layer may be equal to a total planar area of the window, in a top plan view.

In an embodiment, the protection film may include a first side surface corresponding to the bending portion and to the first side surface of each of the window and the display panel, and remaining side surfaces except for the first side surface of the protection portion, and the remaining side surfaces of the window and the protection portion may be respectively aligned with each other.

In an embodiment, a total planar area of the protection portion may be equal to a total planar area of the window, in a top plan view.

In an embodiment, at a same side of the display device, the remaining side surfaces of the display panel and the remaining side surface of the window may have surface roughnesses different from each other.

In an embodiment, each of the remaining side surfaces of the window and the display panel which are respectively aligned with teach other may be parallel to a thickness direction of the display panel.

In an embodiment, the display device may further include a circuit substrate connected to the display panel at the bending portion, and a portion of the bending portion may overlap the flat portion along a thickness direction of the display panel.

According to an embodiment of the invention, a display device may include a window through which an image is viewable from outside the display device, a display panel from which the image is provided to the window, a polarization layer disposed between the window and the display panel, and a protection film facing the window with the display panel and the polarization layer therebetween. A total planar area of the window may be equal to a total planar area of the polarization layer, in a top plan view.

In an embodiment, a total planar area of the display panel may be equal to the total planar area of the window.

In an embodiment, in the top plan view, at least three side surfaces of the display panel may be respectively aligned with corresponding three side surfaces of the window.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
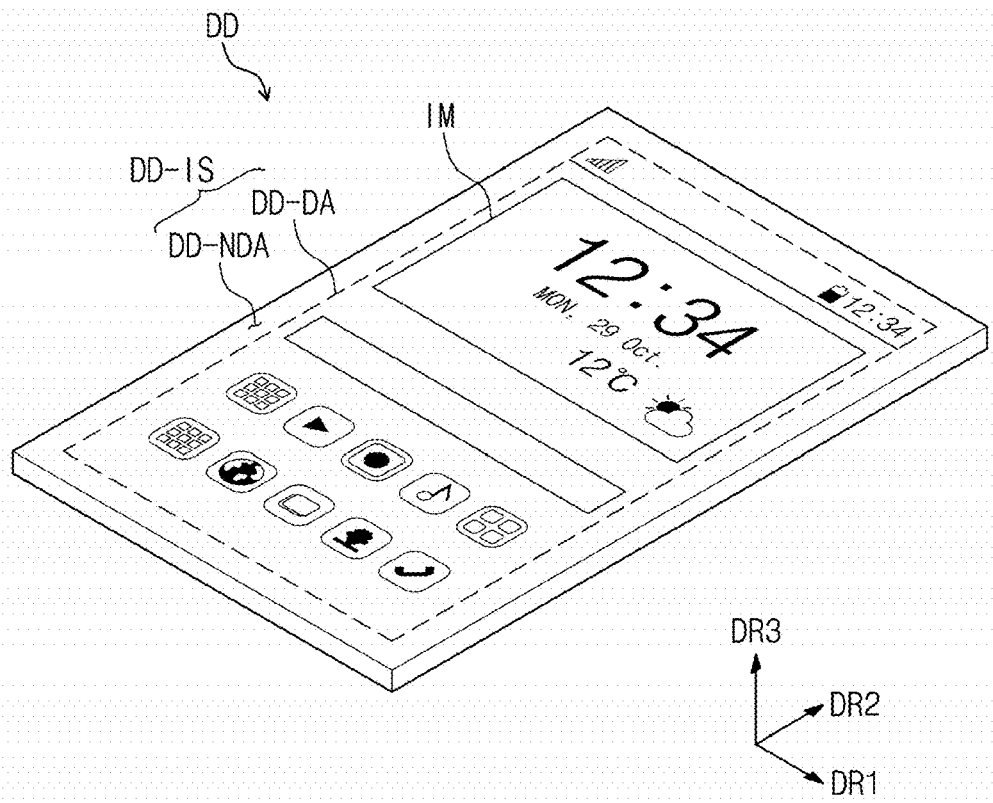
FIG. 1A is a perspective view illustrating an embodiment of a display device.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the invention will now be described more fully with reference to the accompanying drawings, in which example embodiments are shown. Example embodiments of the invention may, however, be embodied in many different forms and should not be construed as being limited to the embodiments set forth herein; rather, these embodiments are provided so that this disclosure will be thorough and complete, and will fully convey the example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout.

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the invention are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
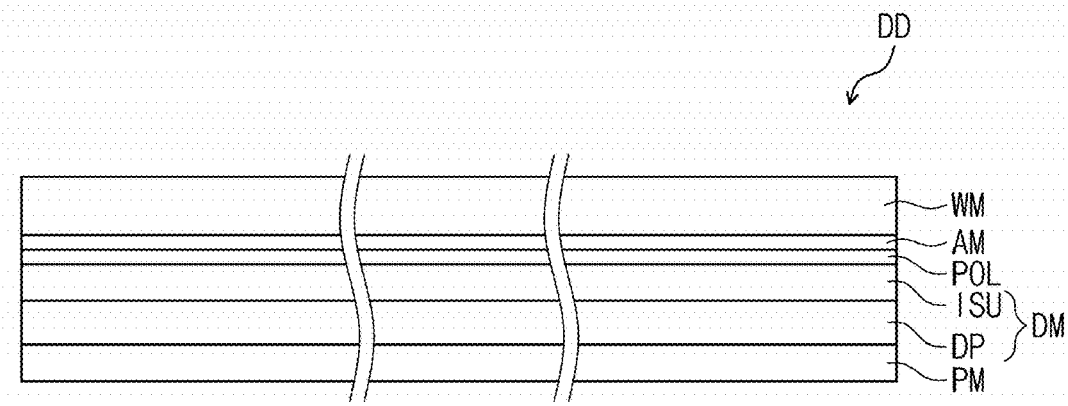
FIG. 1B is a cross-sectional view illustrating an embodiment of a display device.

FIG. 1A is a perspective view illustrating an embodiment of a display device. FIG. 1B is a cross-sectional view illustrating an embodiment of a display device.

Referring to FIG. 1A, a display device DD may include a display surface DD-IS, which is used to display an image IM. The display surface DD-IS may be defined to be parallel to a first direction DR1 and a second direction DR2 which cross each other. A direction normal to the display surface DD-IS (e.g., a thickness direction of the display device DD) will be referred to as a third direction DR3. In the present specification, the expression "when viewed in a plan view" or "in a plan view" may be used to describe a view of an object or structure along the third direction DR3. In addition, the expression "thickness direction" may be used to represent the third direction DR3.

Hereinafter, the third direction DR3 may be used to differentiate a front or top surface of each element from a back or bottom surface of an element. However, directions indicated by the first to third directions DR1, DR2, and DR3 may not be limited to this example, and, in certain embodiments, they may be changed to indicate other or opposite directions.

The display surface DD-IS may be flat (e.g., a flat display surface DD-IS). The display device DD with a flat display surface DD-IS is illustrated in FIG. 1A, but the invention is not limited to this example. The display device DD may include a curved or three-dimensional display surface DD-IS. In the case where the display device DD has the three-dimensional display surface DD-IS, the display surface DD-IS may include or have defined therein a plurality of display regions that are oriented in different planes from each other and extending bent or curbed in different directions from each other. In an embodiment, for example, the display surface DD-IS of the display device DD may be shaped like a surface of a polygonal pillar.

The display device DD may be used as a part of an electronic device which displays a static and/or a dynamic image IM, such as a mobile phone, as shown in FIG. 1A. Although not shown, the mobile phone may further include an electronic module, a camera module, a power module, and so forth, which are mounted on a mainboard and are provided in a bracket or case of the electronic device, along with the display device DD. Such modules may receive input from outside the electronic device and/or provide output from the electronic device to outside thereof. The display device DD may be used for relatively large-sized electronic devices (e.g., television sets and monitors) or relatively small-sized or medium-sized electronic devices (e.g., tablets, car navigation systems, game machines, and smart watches).

The display surface DD-IS may include a display region DD-DA at which the image IM is displayed, and a non-display region DD-NDA adjacent to the display region DD-DA. The non-display region DD-NDA may not be used to display an image. Application icons and a clock widget are illustrated as an example of the image IM.

As shown in FIG. 1A, the display region DD-DA may be rectangular or tetragonal in an overall planar shape, and the non-display region DD-NDA adjacent to the display region DD-DA may enclose the display region DD-DA in a top plan view. However, the invention is not limited thereto, and the planar shapes of the display and non-display regions DD-DA and DD-NDA may be variously changed in a mutually influential manner. In an embodiment, for example, the non-display region DD-NDA may be disposed adjacent to a side portion of the display region DD-DA or may be omitted. A sum of a planar area of the display region DD-DA and the non-display region DD-NDA may define an entirety of the total planar area of the display surface DD-IS, without being limited thereto.

Referring to FIG. 1B, the display device DD may include a protection film PM, a display module DM, a polarization layer POL, an adhesive layer AM, and a window WM.

The display module DM may be disposed between the protection film PM and the polarization layer POL, and may include a display panel DP and an input sensing unit ISU. The display panel DP may be disposed on the protection film PM and may generate an image IM, which will be displayed at the display region DD-DA of FIG. 1A, and transfer the image to the window WM. The image IM is transmittable through the window WM and is viewable through the window WM, from outside the display device DD.

The input sensing unit ISU may be disposed on the display panel DP. As an example, the input sensing unit ISU may be directly disposed on the display panel DP, but is not limited thereto. In the present specification, the expression "an element A may be directly disposed on an element B" means that an adhesive layer/member is not disposed between the elements A and B. That is, as an element A being "directly disposed" on an element B, the elements may form an interface at which the elements are bonded to each other, such as to define a "direct bond" therebetween.

The input sensing unit ISU may sense an input from outside the display device, (e.g., an external input) in a capacitive sensing manner. The external input may be provided in various forms. In an embodiment, for example, the external input may include various types of external inputs, such as a part of a user's body, a stylus pen, light, heat, or pressure. The external input may include a non-touching-type event (e.g., a hovering event of an object near or proximate to the input sensing unit ISU, without contact to the display device DD), in addition to such a touching-type event (e.g., with contact of an object to the display device DD).

The invention is not limited to a specific sensing method of the input sensing unit ISU, and in an embodiment, the input sensing unit ISU may sense an external input in an electromagnetic induction manner or a pressure-sensing manner. In another embodiment, the input sensing unit ISU may be separately fabricated from other components of the display device DD and then may be subsequently attached to another component of the display panel DP such as by an adhesive member like the adhesive layer AM, or the input sensing unit ISU may be omitted from the display device DD.

The adhesive layer AM may attach the window WM and the polarization layer POL to each other. In the case where the polarization layer POL is omitted, the adhesive layer AM may be disposed between the window WM and the display module DM and attach these two components to each other.

The adhesive layer AM may be an optically clear adhesive ("OCA") film, an optically clear resin ("OCR") film, or a pressure sensitive adhesive ("PSA") film.

The polarization layer POL may be disposed on a viewing side of the display module DM to transmit a portion of an externally incident light to the display device DD having a specific wavelength range and to block another portion of the externally incident light in a wavelength range different from the specific wavelength range. Thus, the polarization layer POL at the viewing side of the display module DM may reduce an overall reflection of the display device DD caused by the externally incident light thereto. However, the invention is not limited to this example, and in an embodiment, the polarization layer POL may be disposed on the display panel DP, that is, between the input sensing unit ISU and the display panel DP in FIG. 1B. In this case, the polarization layer POL and the input sensing unit ISU may be attached to each other by an adhesive member such as the adhesive layer AM.

The protection film PM may reduce or effectively prevent entry of moisture from outside the display device DD into the display module DM and may absorb shock or impact to the display device DD the outside thereof.

The protection film PM may include a plastic film serving as a base layer of the protection film PM. The protection film PM may include a plastic film containing one selected from polyethersulfone ("PES"), polyacrylate, polyetherimide ("PEI"), polyethylenenaphthalate ("PEN"), polyethyleneterephthalate ("PET"), polyphenylene sulfide ("PPS"), polyacrylate, polyimide ("PI"), polycarbonate ("PC"), poly(arylene ethersulfone), and combination thereof.

Materials for the protection film PM are not limited to a plastic such as plastic resins, and in an embodiment, various organic and/or inorganic composites may be used for the protection film PM. The protection film PM may include a porous organic layer and an inorganic material which fills pores of the organic layer. The protection film PM may further include at least one functional layer provided or formed on the plastic film. The functional layer may include a resin layer and may be provided or formed by a coating method.

Figure 2A:
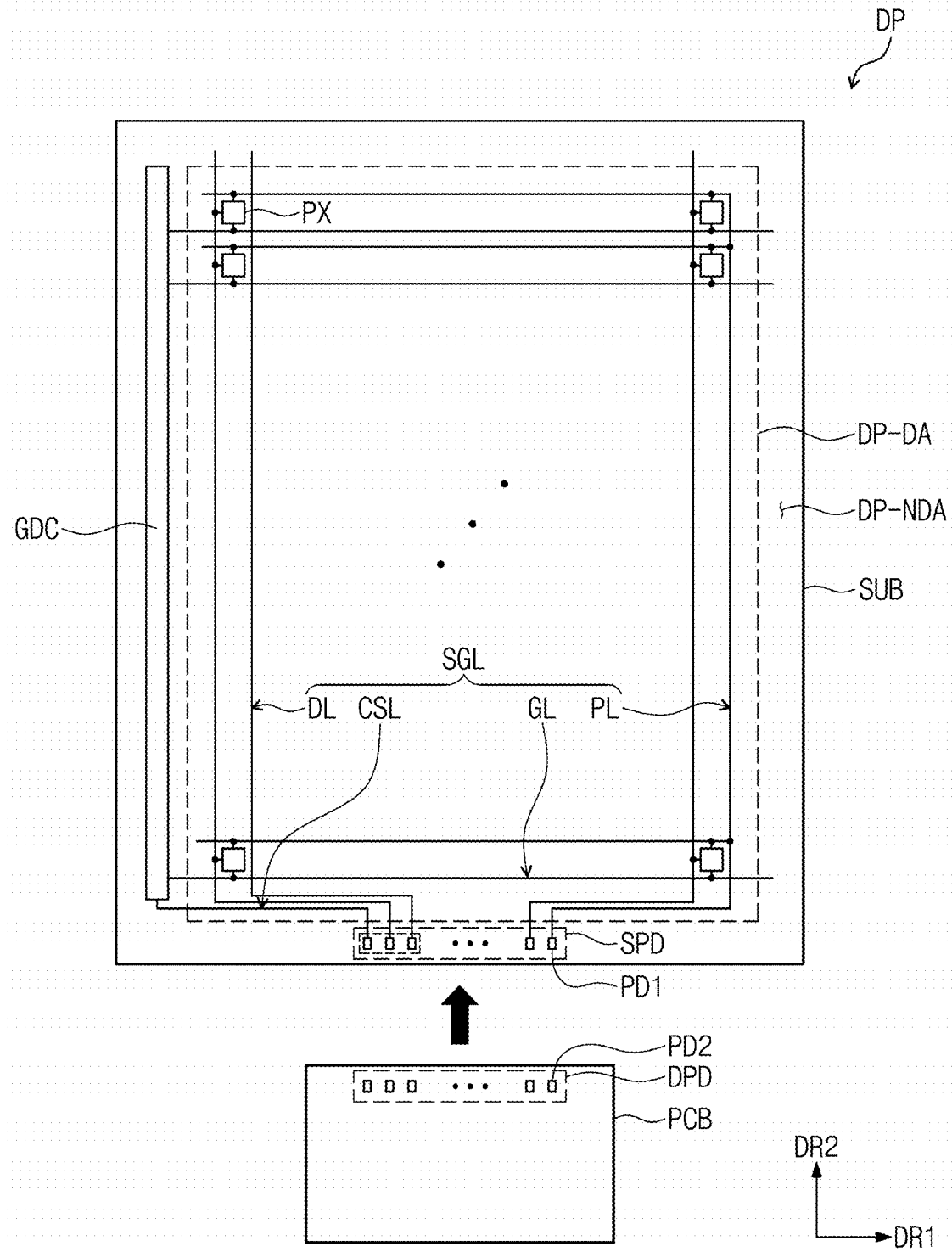
FIG. 2A is a top plan view illustrating an embodiment of a display panel.
Figure 2B:
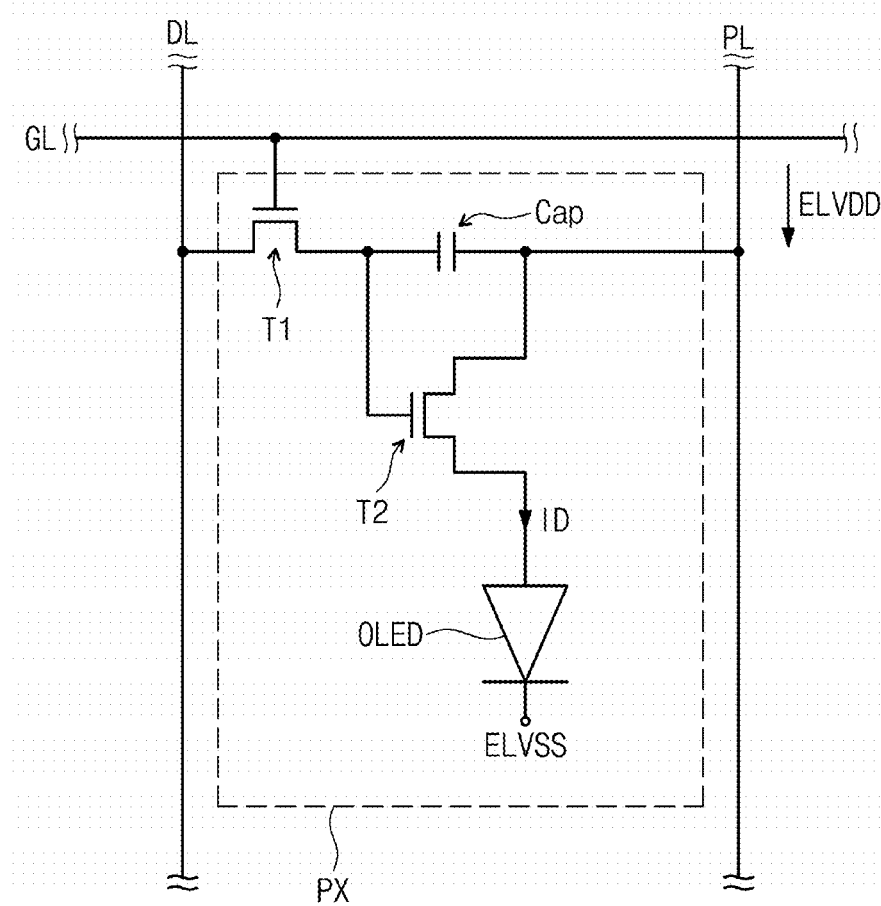
FIG. 2B is an equivalent circuit diagram illustrating an embodiment of a pixel.
Figure 2C:
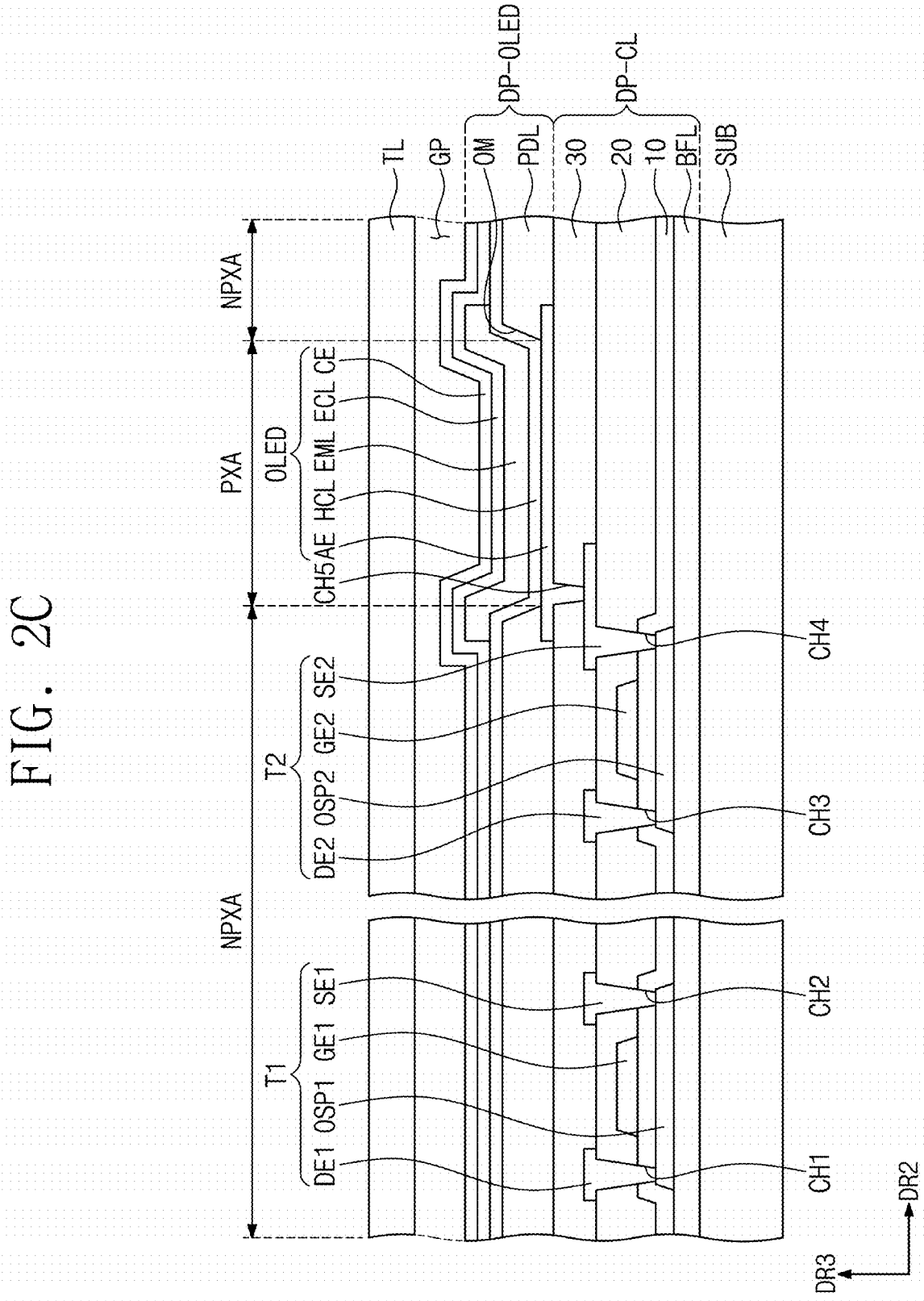
FIG. 2C is a cross-sectional view illustrating an embodiment of a portion of a display panel.

FIG. 2A is a top plan view illustrating an embodiment of a display panel. FIG. 2B is an equivalent circuit diagram illustrating an embodiment of a pixel of a display device. FIG. 2C is an enlarged cross-sectional view illustrating an embodiment of a portion of a display panel.

Referring to FIG. 2A, the display panel DP may include a driving circuit GDC, a plurality of signal lines SGL, a first pad PD1 provided in plural (e.g., a plurality of first pads PD1 or first pads PD1) disposed in a first bonding region SPD, and a pixel PX provided in plural (e.g., a plurality of pixels PX or pixels PX).

The display panel DP may include a display region DP-DA and a non-display region DP-NDA. The display region DP-DA in FIG. 2A may correspond to the display region DD-DA shown in FIG. 1A, and the non-display region DP-NDA in FIG. 2A may correspond to the non-display region DD-NDA shown in FIG. 1A.

In an embodiment, the display panel DP may be a liquid crystal display panel, an organic light emitting display panel, an electrophoretic display panel, an electrowetting display panel, and so forth, and the invention is not limited to a specific kind of the display panel DP. Hereinafter, the organic light emitting display panel will be described as an example of the display panel DP.

The pixels PX may be disposed in the display region DP-DA. Each of the pixels PX may include an organic light emitting diode and a pixel driving circuit which is connected thereto. The driving circuit GDC, the signal lines SGL, the first pads PD1, and pixel driving circuit may be included in a circuit device layer DP-CL shown in FIG. 2C.

The driving circuit GDC may be provided as a scan driving circuit. The driving circuit GDC may generate an electronic signal such as a plurality of scan signals and may sequentially output the scan signals to a scan line GL provided in plural (e.g., a plurality of scan lines GL or scan lines GL) to be described below. In addition, the driving circuit GDC may further output other electronic signals such as control signals, driving signals, etc. to the pixel driving circuit of the pixels PX.

The driving circuit GDC may include a plurality of thin-film transistors that are provided or formed by the same process as that for providing or forming the pixel driving circuit of the pixels PX (e.g., by a low temperature polycrystalline silicon ("LTPS") process or a low temperature polycrystalline oxide ("LTPO") process). That is, respective layers of thin-film transistors and the pixel driving circuit of the pixels PX may be formed from a same material layer and/or may be disposed in a same layer among layers of the display panel DP.

The signal lines SGL may be disposed on a base layer SUB. The signal lines SGL may include scan lines GL, a data line DL provided in plural (e.g., data lines DL), a power line PL, and a control signal line CSL. Each of the scan lines GL may be connected to corresponding ones of the pixels PX, and each of the data lines DL may be connected to corresponding ones of the pixels PX. The power line PL may be connected to one or more of the pixels PX. One or more of the control signal line CSL may provide the control signals to the driving circuit GDC.

The signal lines SGL may be overlapped with or correspond to each of the display region DP-DA and the non-display region DP-NDA. Each of the signal lines SGL may include a pad portion and a line portion. The line portion may be overlapped with or correspond to the display region DP-DA and the non-display region DP-NDA. The pad portion may be connected to an end portion of the line portion (e.g., end or distal end). The pad portion may be disposed in the non-display region DP-NDA and may correspond to the first pads PD1 disposed in the first bonding region SPD.

In addition, the display device DD may further include a circuit substrate PCB connected to the display panel DP. The circuit substrate PCB may be electrically connectable (refer to arrow in FIG. 2A) to the display panel DP at the first bonding region SPD thereof, and may include a second pad PD2 provided in plural (e.g., a plurality of second pads PD2 or second pads PD2) disposed in a second bonding region DPD. The second pads PD2 may be respectively electrically connected to the first pads PD1, which are disposed in the first bonding region SPD of the display panel DP, to transmit a plurality of driving signals to the display panel DP from outside thereof. The circuit substrate PCB may be rigid or flexible. In an embodiment, for example, in the case where the circuit substrate PCB is flexible, the circuit substrate PCB may be provided in the form of a flexible printed circuit board.

FIG. 2B illustrates an example of the pixel PX, which is connected to corresponding ones of the signal lines SGL. In one embodiment, the pixel PX may be connected to one scan line GL, one of the data lines DL, and the power line PL. However, the invention is not limited to this example, and elements constituting the pixel PX may be variously changed.

The pixel PX may include an organic light emitting diode OLED serving as a display element with which light is generated, light is emitted and/or an image is displayed. The organic light emitting diode OLED may be a top-emission type diode or a bottom-emission type diode. The pixel PX may include a first transistor T1 (or switching transistor T1), a second transistor T2 (or driving transistor T2), and a capacitor Cap, which are used as a circuit for driving the organic light emitting diode OLED. The organic light emitting diode OLED may generate light, in response to electrical signals transmitted from the first transistor T1 and the second transistor T2.

If a scan signal is applied to the scan line GL, the first transistor T1 may output a data signal, which is applied to the data line DL, in response to the scan signal. The capacitor Cap may be charged to have a voltage corresponding to the data signal received from the first transistor T1. A first power voltage ELVDD may be provided to the second transistor T2, and a second power voltage ELVSS may be provided to the organic light emitting diode OLED. The second power voltage ELVSS may be lower than the first power voltage ELVDD.

The second transistor T2 may be connected to the organic light emitting diode OLED. The second transistor T2 may control a driving electrical current ID flowing through the organic light emitting diode OLED, based on an amount of electric charges stored in the capacitor Cap. The organic light emitting diode OLED may emit light under the driving electrical current ID, when the second transistor T2 is in a turn-on period.

Referring to FIG. 2C, the cross-sectional view of FIG. 2C illustrates a portion of the display panel DP corresponding to the equivalent circuit of FIG. 2B. The display panel DP may include the base layer SUB, the circuit device layer DP-CL, a display device layer DP-OLED, and an encapsulation substrate TL. The circuit device layer DP-CL, the display device layer DP-OLED, and the encapsulation substrate TL may be sequentially stacked on the base layer SUB. The display panel DP may be flexible or rigid, according to an embodiment of the invention.

The base layer SUB may include a glass substrate, a sapphire substrate, a plastic film, and so forth.

The circuit device layer DP-CL may include at least one insulating layer and a circuit device. The circuit device may include one or more signal line, a pixel driving circuit connected thereto, and so forth. In an embodiment, the providing or forming of the circuit device layer DP-CL may include providing or forming an insulating layer, a semiconductor layer and a conductive layer using a coating or deposition process, and patterning the insulating layer, the semiconductor layer and the conductive layer using a photolithography and etching process.

The circuit device layer DP-CL may include a buffer layer BFL, a first intermediate inorganic layer 10, and a second intermediate inorganic layer 20, which include or are formed of inorganic materials, and an intermediate organic layer 30, which includes or is formed of an organic material. The buffer layer BFL may include a plurality of stacked inorganic layers. FIG. 2C illustrates an example of relative positions of some elements (e.g., a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2) constituting the switching transistor T1 and the driving transistor T2. As a contact hole, a first penetration hole CH1, a second penetration hole CH2, a third penetration hole CH3, a fourth penetration hole CH4 and a fifth penetration hole CH5) (e.g., first to fifth penetration holes CH1, CH2, CH3, CH4 and CH5) may also be exemplarily illustrated in FIG. 2C.

The display device layer DP-OLED may include the organic light emitting diode OLED. The display device layer DP-OLED may include a pixel definition layer PDL. In an embodiment, for example, the pixel definition layer PDL may be an organic layer A first electrode AE may be disposed on the intermediate organic layer 30. The first electrode AE may be connected to the second output electrode SE2 at or through a fifth penetration hole CH5 penetrating the intermediate organic layer 30. An opening OM may be defined in or by portions of the pixel definition layer PDL. The opening OM of the pixel definition layer PDL may expose at least a portion of the first electrode AE. Hereinafter, the opening OM of the pixel definition layer PDL will be referred to as a light-emitting opening, OM for a clear distinction from other openings.

Although not shown, a spacer may be disposed on a top surface of the pixel definition layer PDL to be overlapped with a portion of the pixel definition layer PDL. The spacer may be continuously connected to the pixel definition layer PDL to constitute a single object or monolayer, or may be an insulating structure, which is provided or formed by a separate layer from the pixel definition layer PDL such as by an additional process in manufacturing the display device DD.

As shown in FIG. 2C, the display panel DP may include a light-emitting region PXA and a non-light-emitting region NPXA which is adjacent to the light-emitting region PXA. In a top plan view, for example, the non-light-emitting region NPXA may enclose the light-emitting region PXA. In the present embodiment, the light-emitting region PXA may be defined to correspond to the portion of the first electrode AE exposed by the light-emitting opening OM. In an embodiment, the light-emitting region PXA and the non-light-emitting region NPXA may also be considered portions of a pixel PX.

A hole control layer HCL may be provided in both of the light-emitting region PXA and the non-light-emitting region NPXA. The hole control layer HCL may include a hole transport layer and, in an embodiment, the hole control layer HCL may further include a hole injection layer. A light emitting layer EML may be disposed on the hole control layer HCL. The light emitting layer EML may be provided on a region corresponding to the light-emitting opening OM. In other words, the light emitting layer EML may be provided in plural to include a plurality of isolated patterns of a light emitting material, each of which is provided for a corresponding one of the pixels PX. The light emitting layer EML may be provided or formed of or include at least one of an organic material or an inorganic material. The light emitting layer EML may generate light of specific color under control of the pixel circuit.

An electron control layer ECL may be disposed on the light emitting layer EML. The electron control layer ECL may include an electron transport layer, and in an embodiment, the electron control layer ECL may further include an electron injection layer. The hole control layer HCL and the electron control layer ECL may be provided or formed using a mask such as an open mask, and thus, the hole control layer HCL and the electron control layer ECL may be provided or formed in common corresponding to a plurality of pixels PX. A second electrode CE may be disposed on the electron control layer ECL. The second electrode CE may be a single pattern of a second electrode material, which is disposed in common on the electron control layer ECL corresponding to the plurality of pixels PX, respectively.

The encapsulation substrate TL may be disposed on the second electrode CE. The encapsulation substrate TL may be provided in the form of a glass substrate and may be spaced apart from the second electrode CE by a specific distance along the third direction DR3. Thus, a gap GP may be provided or formed between the second electrode CE and the encapsulation substrate TL, along the third direction DR3.

However, the invention is not limited to this example, and in the case where the display panel DP is flexible, the encapsulation substrate TL may be provided in the form of a thin film encapsulation layer. In this case, the thin film encapsulation layer may be disposed on the display device layer DP-OLED to cover the second electrode CE. The thin film encapsulation layer may collectively include a plurality of thin films. In addition, the expression "the display panel DP is flexible" may mean that the display panel DP can be folded or bent.

Figure 3:
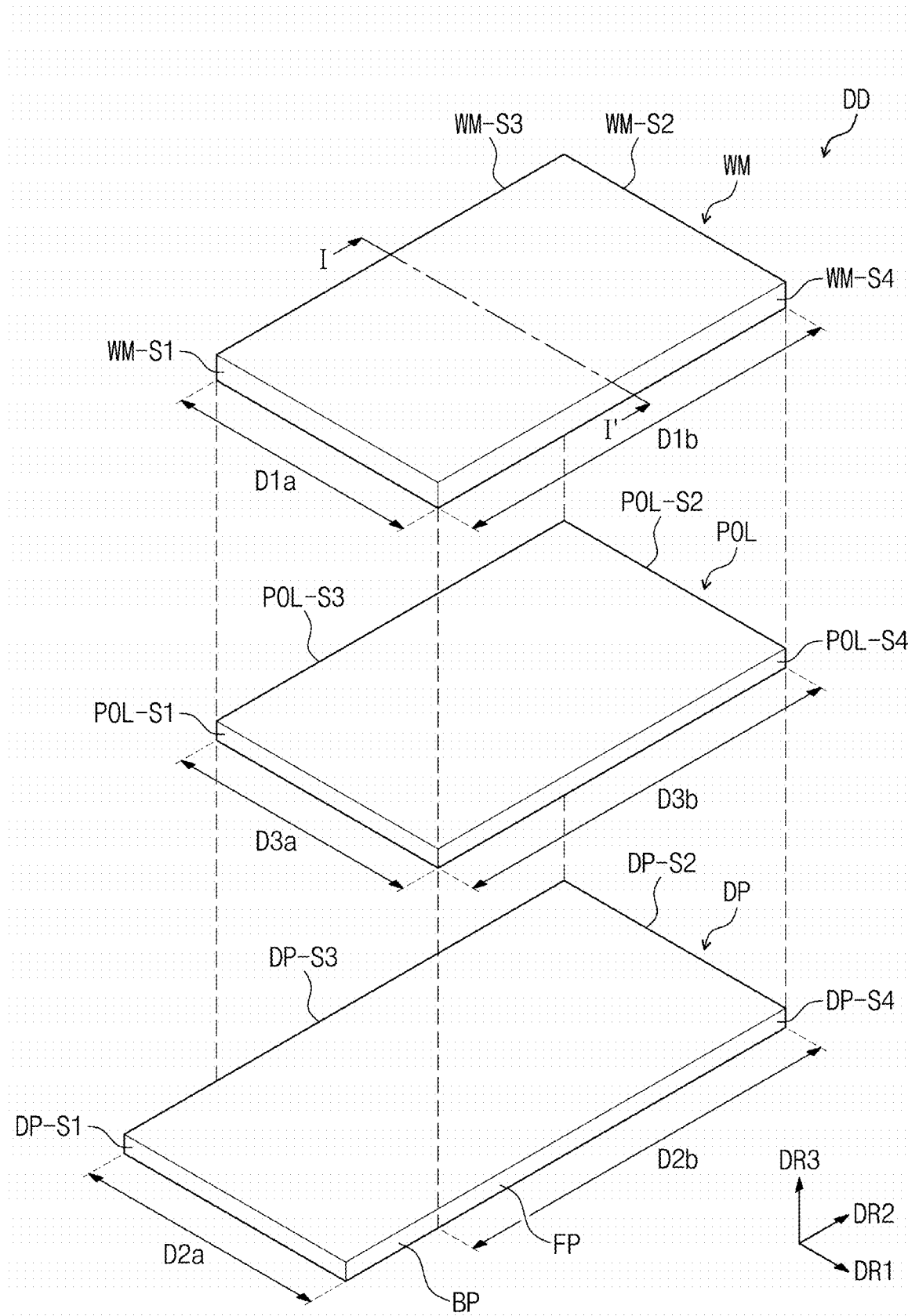
FIG. 3 is an exploded perspective view illustrating an embodiment of a display device.
Figure 4:
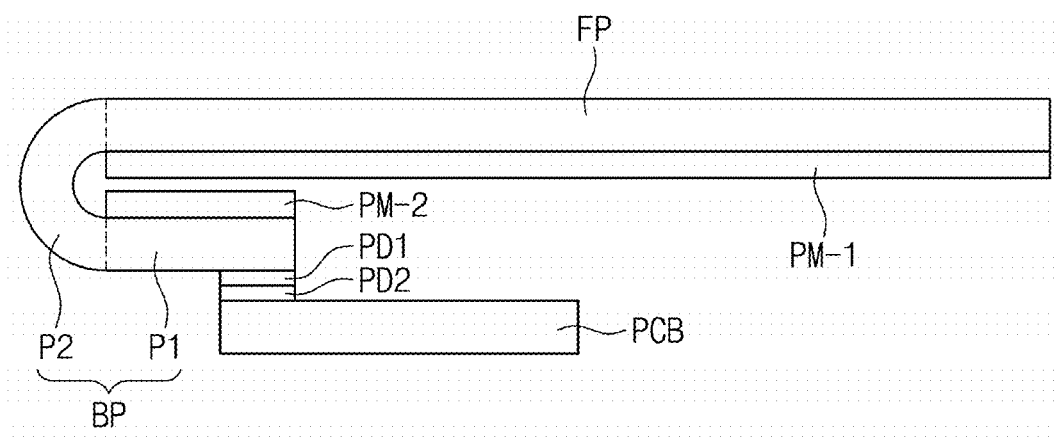
FIG. 4 is a cross-sectional view illustrating an embodiment of a display panel which is bent.

FIG. 3 is an exploded perspective view illustrating an embodiment of a display device DD. FIG. 4 is a cross-sectional view illustrating an embodiment of a display panel which is bent at an end portion thereof.

To reduce complexity in illustration, the display device DD of FIG. 3 is illustrated to have the window WM, the display panel DP, and the polarization layer POL shown in FIG. 1B. Although some elements, such as the input sensing unit ISU and the protection film PM are omitted from FIG. 3, the display device DD of FIG. 3 is understood to have all elements shown in FIG. 1B.

Referring to FIG. 3, the display panel DP may include a flat portion FP and a bending portion BP which extends from the flat portion FP. The flat portion FP may be overlapped with or correspond to the display region DD-DA of FIG. 1A and may be provided to have substantially a flat shape. In the present specification, the expression 'an element A is flat' may mean that the element A is parallel to an unbent plane defined by the first direction DR1 and the second direction DR2 crossing each other. In addition, in the present specification, the expression 'an element A is overlapped with an element B' may mean that the elements A and B are overlapped with or correspond to each other along the third direction DR3.

The display panel DP may include a top surface facing a bottom surface of the polarization layer POL along the third direction DR3, a bottom surface, and a plurality of first side surfaces DP-S1, DP-S2, DP-S3 and DP-S4 each connecting the top surface and the bottom surface of the display panel DP to each other. Although not shown, the bottom surface of the display panel DP may face a top surface of the protection film PM. The first side surfaces of the display panel DP may include first side surfaces DP-S1 and DP-S2 facing each other along the second direction DR2 and first side surfaces DP-S3 and DP-S4 facing each other along the first direction DR1.

The bending portion BP may be adjacent to or correspond to one (e.g., the first side surface DP-S1) among the first side surfaces DP-S1 and DP-S2 of the display panel DP, which face each other along the second direction DR2. The bending portion BP may be bendable relative to the flat portion FP, at the first side surface DP-S1.

The window WM may be disposed on the display panel DP. The window WM may be overlapped with the display region DD-DA and may be provided to have substantially a flat shape. As an example, if the display device DD is of a relatively rigid type, the window WM may be provided in the form of glass. As another example, if the display device DD is of a flexible type, the window WM may be provided in the form of a film. However, the invention is not limited to these examples, and a material included in the window WM may be variously changed, depending of the type of the display device DD.

In an embodiment, the window WM may include a top surface WM-US (FIG. 9), a bottom surface facing a top surface of the polarization layer POL, and a plurality of second side surfaces WM-S1, WM-S2, WM-S3 and WM-S4 each connecting the top surface and the bottom surface of the window WM to each other. The top surface of the window WM may be defined as the display surface DD-IS of FIG. 1A. The display surface DD-IS may form an external surface of the display device DD at a viewing side thereof.

The second side surfaces of the window WM may include second side surfaces WM-S1 and WM-S2 facing each other along the second direction DR2 and second side surfaces WM-S3 and WM-S4 facing each other along the first direction DR1.

The polarization layer POL may be disposed between the display panel DP and the window WM, along the third direction DR3. The polarization layer POL may include the top surface thereof facing the bottom surface of the window WM, the bottom surface thereof facing the top surface of the display panel DP, and a plurality of third side surfaces POL-S1, POL-S2, POL-S3 and POL-S4 each connecting the top surface and the bottom surface of the polarization layer POL to each other.

The third side surfaces of the polarization layer POL may include third side surfaces POL-S1 and POL-S2 facing each other along the second direction DR2 and third side surfaces POL-S3 and POL-S4 facing each other along the first direction DR1.

When viewed in a plan view, the window WM may have a first area. The first area of the window WM may be a planar area, which is defined by a first length D1$a$ extending along the first direction DR1, and a second length D1$b$ extending along the second direction DR2. The first length D1$a$ may represent an entire dimension of the window WM which extends along the first direction DR1, and the second length D1$b$ may represent an entire dimension of the window WM which extends along second direction DR2. A size or dimension of the first area, may be a product of such first length and such second length corresponding thereto.

When viewed in a plan view, the display panel DP may have a second area. The second area of the display panel DP may be an area, which is defined by a first length D2$a$ extending along the first direction DR1 and a second length D2b extending along the second direction DR2. The second area may correspond to a planar area of the flat portion FP. The first length D2a may represent an entire dimension of the display panel DP which extends along the first direction DR1, and the second length D2b may represent a portion of an entire dimension of the display panel DP which extends along second direction DR2. A size or dimension of the second area, may be a product of such first length and such second length corresponding thereto.

In an embodiment, the first area of the window WM may be substantially equal to the second area of the display panel DP which corresponds to the flat portion FP. That is, a total planar area of the first area may be equal to a total planar area of the second area. In an embodiment, for example, the window WM may be wholly overlapped with the flat portion FP of the display panel DP. As a result, the first side surfaces DP-S2, DP-S3, and DP-S4 of the display panel DP (e.g., except the first side surface DP-S1 adjacent to the bending portion BP) may be respectively aligned with corresponding second side surfaces (e.g., WM-S2, WM-S3, WM-S4) of the window WM.

In the present specification, an expression "a side surface of an element A is aligned with a side surface of an element B" may mean that the elements A and B have side surfaces at edges or ends thereof which are aligned with each other by, for example, a laser process. In other words, an edge of the element A may be aligned with an edge of the element B. In an embodiment, for example, in the case where the elements A and B are stacked, an overlapped portion between the elements A and B may be irradiated with a laser beam. As a result, the overlapped portion between the elements A and B may be cut to form the aligned side surfaces.

When viewed in a plan view, the polarization layer POL may have a third area. The third area of the polarization layer POL may be an area, which is defined by a first length D3a extending along the first direction DR1 and a second length D3b extending along the second direction D2. The first length D3a may represent an entire dimension of the polarization layer POL which extends along the first direction DR1, and the second length D3b may represent an entire dimension of the polarization layer POL which extends along second direction DR2. A size or dimension of the third, may be a product of such first length and such second length corresponding thereto.

In an embodiment, the third area of the polarization layer POL may be substantially equal to the first area of the window WM. That is, a total planar area of the third area may be equal to a total planar area of each of the first area and the second area. In other words, the polarization layer POL may be wholly overlapped with the window WM. As a result, the third side surfaces POL-S1, POL-S2, POL-S3, and POL-S4 of the polarization layer POL may be respectively aligned with the second side surfaces WM-S1, WM-S2, WM-S3, and WM-S4 of the window WM.

In an embodiment where a total planar area of the third area is equal to a total planar area of each of the first area and the second area, the first lengths D1a, D2a and D3a may be equal to each other and the second lengths D1b, D2b and D3b may be equal to each other.

Referring to FIG. 3, considered in another way, the side surfaces WM-S1, POL-S1 and DP-S1 may be considered as "first side surfaces" among the window WM, the polarization layer POL and the display panel DP, respectively, where each of these "first side surfaces" corresponds to the bending portion BP. The side surfaces WM-S2 through WM-S4, POL-S2 through POL-S4 and DP-S2 through DP-S4 may be considered as "remaining surfaces" of the window WM, the polarization layer POL and the display panel DP, respectively, except for the respective "first side surfaces" (e.g., WM-S1, POL-S1 and DP-S1) thereof. In this consideration, the bending portion BP of the display panel DP extends further along the second direction DR2 than both the first side surface WM-S1 of the window WM and the first side surface POL-S1 of the polarization layer POL.

Referring to FIGS. 3 and 4, the display panel DP and components thereof may be bendable at the bending portion BP, along a bending axis which extends along the first direction DR1. The bending portion BP may include a first portion P1 at a distal end of the display panel DP (e.g., defining the first side surface DP-S1), and a second portion P2 which connects the flat portion FP and the first portion P1 to each other.

Referring to FIG. 4, the display panel DP which is bent at the bending portion BP disposes the first portion P1 overlapped with the flat portion FP along the third direction DR3, and the second portion P2 non-overlapped with the flat portion FP. The display panel DP which is bent at the bending portion BP disposes the first portion P1 of the bending portion BP to have a flat shape, and the second portion P2 to have a bent shape. The second portion P2 within the display panel DP which is bent may define an end portion of the display panel DP and/or the display device DD which is bent. In the present specification the flat portion FP, the first portion P1 and the second portion P2 may be connected to each other to constitute a single element substantially. That is, the flat portion FP may extend further than the ends of the window WM and the polarization layer POL, to define each of the first portion P1 and the second portion P2. Referring back to FIG. 2C, one or more of the layers of the display panel DP may extend further than the ends of the window WM and the polarization layer POL, to define each of the first portion P1 and the second portion P2, without being limited thereto.

Although the display panel DP is described to include the flat portion FP and the bending portion BP, the invention is not limited to this example. In an embodiment, for example, the display panel DP may be provided to have only the flat portion FP, and in this case, the first side surfaces DP-S1, DP-S2, DP-S3 and DP-S4 of the display panel DP may be respectively aligned with the second side surfaces WM-S1, WM-S2, WM-S3 and WM-S4 of the window WM.

The display device DD which is bent may further dispose the circuit substrate PCB connected to the display panel DP at the bending portion BP (e.g., at the first portion P1) to be overlapped with the flat portion FP along the third direction DR3. The circuit substrate PCB may generate a plurality of driving signals, which are provided to the display panel DP to operate the display panel DP, and provide the driving signals to the display panel DP. The first pad PD1 disposed on the first portion P1 and the second pad PD2 disposed on the circuit substrate PCB may be bonded to each other to connect the circuit substrate PCB to the display panel DP, and thus, the driving signals may be transmitted between the first portion P1 of the display panel DP and the circuit substrate PCB external thereto.

In addition, the protection film PM of FIG. 4 may include a first protection portion PM-1 disposed corresponding to the flat portion FP and a second protection portion PM-2 corresponding to on the first portion P1. Although not shown in FIG. 3, the first protection portion PM-1 disposed corresponding to the flat portion FP may include a plurality of fourth side surfaces each connecting a top surface to a bottom surface of the protection film PM. One of the fourth side surfaces of the protection film PM may correspond to the first side surface DP-S1 of the display panel DP (e.g., at the second protection portion PM-2), and the others of the fourth side surfaces of the first protection portion PM-1 (e.g., at each of the first protection portion PM-1 and the second protection portion PM-2) may be respectively aligned with the remaining first side surfaces DP-S2, DP-S3, and DP-S4 defined by the flat portion FP of the display panel DP.

A total planar area of the second protection portion PM-2 may be smaller than a total planar area of the first protection portion PM-1. Referring again to FIG. 4, the protection film PM is disconnected at the bending portion BP (e.g., at the second portion P2).

As described above, the window WM, the polarization layer POL, the display panel DP, and the protection film PM may have edges thereof at a same side of the display device DD which are aligned with each other, such as by a laser process. This will be described in more detail below.

Figure 5A:
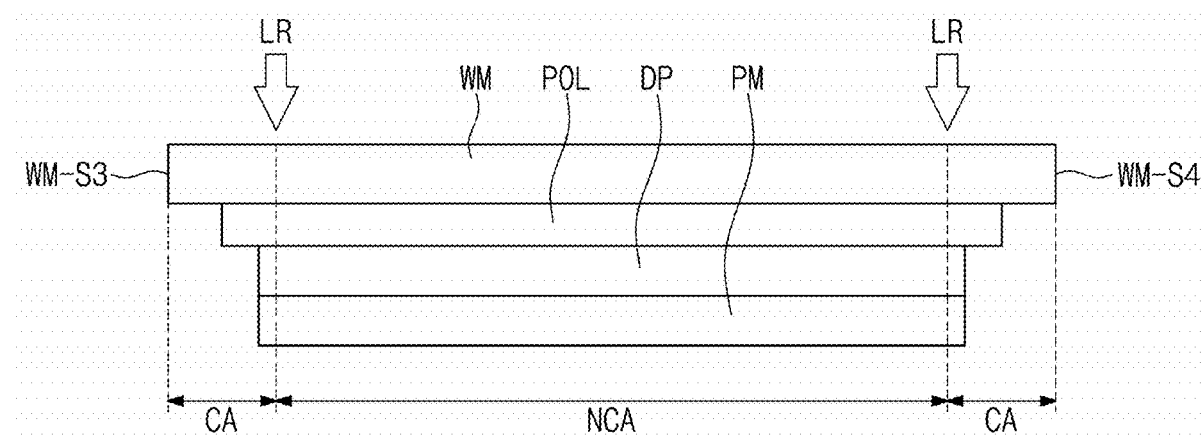
FIG. 5A is a diagram illustrating an embodiment of a method of cutting a display device using laser.
Figure 5B:
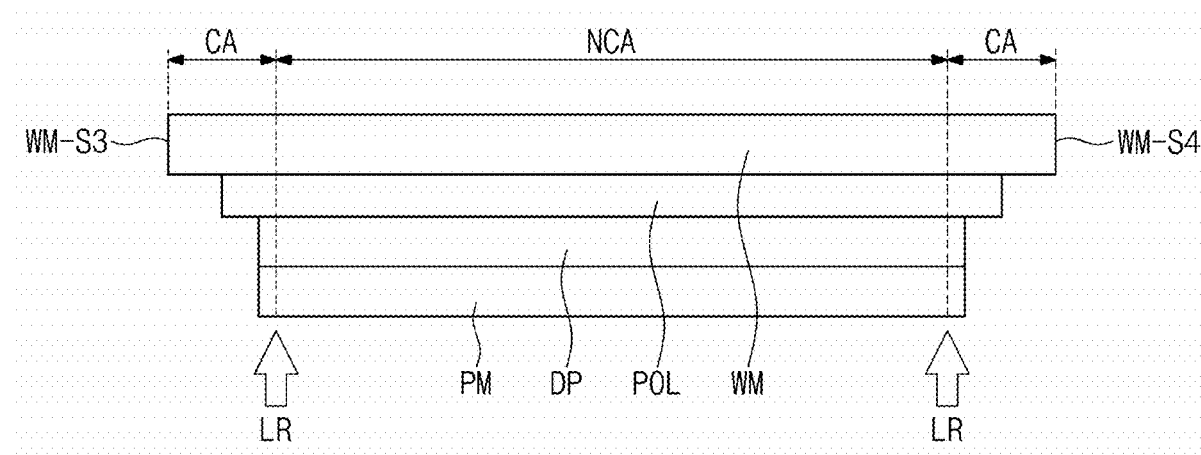
FIG. 5B is a diagram illustrating another embodiment of a method of cutting a display device using laser.
Figure 6:
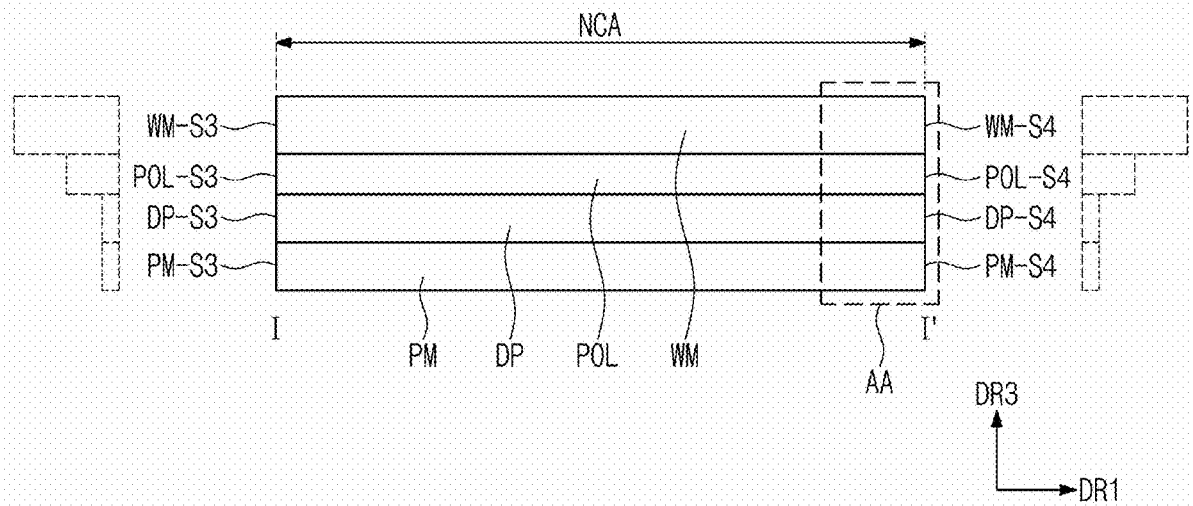
FIG. 6 is a cross-sectional view illustrating an embodiment of a display device formed from a stacked structure which is cut.
Figure 7:
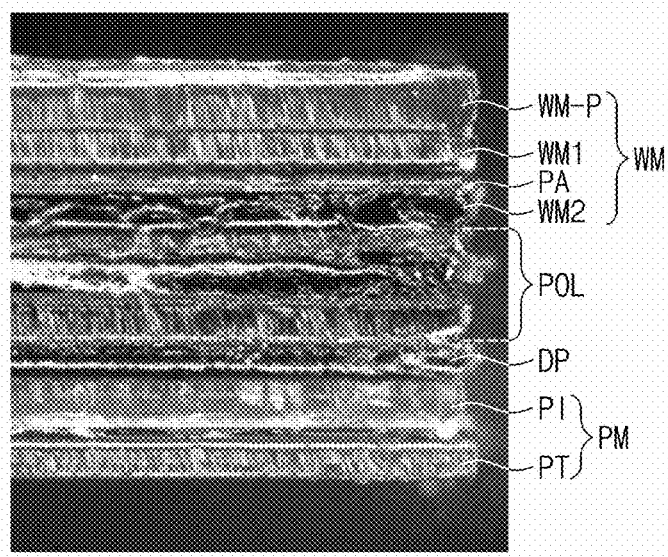
FIG. 7 is an enlarged view illustrating portion 'AA' of FIG. 6.

FIG. 5A is a diagram illustrating an embodiment of a method of cutting a display device using laser. FIG. 5B is a diagram illustrating another embodiment of a method of cutting a display device using laser. FIG. 6 is a cross-sectional view illustrating a display device formed from a stacked structure which is cut. FIG. 7 is an enlarged view illustrating portion 'AA' of FIG. 6.

The views of FIGS. 5A, 5B and 6 may be referenced along line I-I' in FIG. 3, in addition to having the protection film PM disposed under the display panel DP (shown in FIG. 1B). While the views of FIGS. 5A, 5B and 6 represent views along the first direction DR1, it will be understood that the methods detailed below may be applied to one or more end of an element layer along the second direction DR2.

As previously described with reference to FIG. 3, a portion of each of the window WM, the polarization layer POL, and the display panel DP may be simultaneously cut by a laser process. In other words, the side surfaces of the window WM, the polarization layer POL, and the display panel DP, which are formed by the laser process, may be connected to each other and may be provided as a single side surface.

As shown in FIGS. 5A and 5B, a preliminary stacked structure includes preliminary forms of each of the window WM, the polarization layer POL, the display panel DP and the protection film PM each including a cutting region CA at which portions of the preliminary forms of the window WM, the polarization layer POL, the display panel DP and the protection film PM are respectively removed such as by a laser LR, and a non-cutting region NCA at which portions of the preliminary forms of the window WM, the polarization layer POL, the display panel DP and the protection film PM remain (e.g., portions are not cut) for forming a display device DD. In an embodiment, for example, the cutting region CA of the preliminary stacked structure may be a region adjacent to an edge of each element layer among the window WM, the polarization layer POL, the display panel DP and the protection film PM, when viewed in a plan view. A boundary between the cutting region CA and the non-cutting region NCA is shown in dotted line in FIGS. 5A and 5B. A cutting line along which the laser LR is transferred to separate the cutting region CA from the non-cutting region NCA, may be defined at this boundary.

When viewed in a plan view, a planar area of a region of an element layer to be cut and removed from a remaining region thereof, may vary from element layer to element layer. In an embodiment, for example, as shown in FIGS. 5A and 5B, a planar area of a region to be removed is the largest for the window WM and is the smallest for the display panel DP and the protection film PM. However, the invention is not limited to this example, and in an embodiment, a planar area of a removed region for each element layer may be changed.

Referring to FIG. 5A, the laser LR may be incident into the window WM in preliminary form, through the top surface of the window WM. In this case, the laser LR may propagate along a direction from the top surface of the window WM toward the bottom surface of the protection film PM.

Referring to FIG. 5B, the laser LR may be incident into the protection film PM in preliminary form, through the bottom surface of the protection film PM. In this case, the laser LR may propagate along a direction from the bottom surface of the protection film PM toward the top surface of the window WM.

Referring to FIG. 6, the cutting region CA of each of the window WM, the polarization layer POL, the display panel DP, and the protection film PM in preliminary forms, may be separated from the non-cutting region NCA. The non-cutting region NCA of each of the window WM, the polarization layer POL, the display panel DP, and the protection film PM in preliminary forms, may remain to form a display device DD (refer to FIGS. 1B and 3). Thus, each of the window WM, the polarization layer POL, the display panel DP, and the protection film PM in the display device DD provided or formed from the preliminary stacked structure may include at one or more sides of the display device DD, ends of element layers which are aligned with each other.

As an example, the window WM of a display device DD may have the second side surfaces WM-S3 and WM-S4, which are provided or formed by the laser process and face each other along the first direction DR1. Although not shown, the window WM may also have the second side surfaces WM-S1 and WM-S2, which are provided or formed by the laser process and face each other along the second direction DR2.

As an example, the polarization layer POL of the display device DD may have the third side surfaces POL-S3 and POL-S4, which are provided or formed by the laser process and face each other along the first direction DR1. Similarly, the polarization layer POL may also have the third side surfaces POL-S1 and POL-S2, which are provided or formed by the laser process and face each other along the second direction DR2.

As an example, the display panel DP of the display device DD may have the first side surfaces DP-S3 and DP-S4, which are provided or formed by the laser process and face each other along the first direction DR1. Similarly, the display panel DP may also have the first side surfaces DP-S1 and DP-S2, which are provided or formed by the laser process and face each other along the second direction DR2. However, referring to FIG. 3, the first side surface DP-S2 may be aligned with respective side surface of the window WM and the polarization layer POL, while the first side surface DP-S1 may not be aligned with respective side surface of the window WM and the polarization layer POL. Here, a cutting line for providing or forming the second side surface WM-S1 and the third side surface POL-S1, may correspond to a boundary (e.g., imaginary line) between the flat portion FP and the bending portion BP of the display panel DP.

As an example, the protection film PM may have fourth side surfaces PM-S3 and PM-S4, which are provided or formed by the laser process and face each other along the first direction DR1. Similarly, the protection film PM may also have fourth side surfaces (e.g., corresponding to second side surfaces WM-S1 and WM-S2, respectively), which are provided or formed by the laser process and face each other along the second direction DR2. In the case where the display panel DP includes the bending portion BP, the fourth side surface of the protection film PM which corresponds to the second side surface WM-S1 of the window WM, may be separately provided or formed by the laser process such as that shown in FIG. 5B.

As described above, the window WM, the polarization layer POL, the display panel DP, and the protection film PM may have ends (e.g., side surfaces) disposed at a same side of the display device DD, which are aligned with each other such as by the laser process. Thus, the aligned side surfaces of the window WM, the polarization layer POL, the display panel DP, and the protection film PM may define a single side surface of the display device DD, as shown in FIG. 6.

According to an embodiment of the invention, the aligned respective side surfaces of the window WM, the polarization layer POL, the display panel DP, and the protection film PM, which are provided or formed by the laser process, may be disposed substantially parallel to the third direction DR3.

The image of FIG. 7 shows a single side surface of a display device DD, at which the aligned ends (e.g., respective side surfaces) of the window WM, the polarization layer POL, the display panel DP, and the protection film PM of FIG. 6 are disposed.

The window WM may include a window protection film WM-P, a first window portion WM1, a second window portion WM2, and an adhesive layer PA. However, the invention is not limited to this example, and in an embodiment, the window WM may be provided to have the window protection film WM-P and one window portion among the two described above. In other words, the first window portion WM1 and the second window portion WM2 may be provided in the form of a single element or monolayer, and in this case, the adhesive layer PA may be omitted. This will be described in more detail with reference to FIG. 8B.

The protection film PM may include a main protection film PI and an auxiliary protection film PT. In addition, the polarization layer POL may also include a plurality of layers.

In an embodiment, the aligned ends (e.g., respective side surfaces) of the window WM, the polarization layer POL, the display panel DP, and the protection film PM may have a specific surface roughness (hereinafter, 'Ra'). The aligned respective side surfaces of the window WM, the polarization layer POL, the display panel DP, and the protection film PM may become rough by a continuous laser process. Although not shown, a polishing process may be performed on the respective side surface of each element layer, after the laser process.

In an embodiment, for example, as shown in FIG. 7, for respective side surfaces corresponding to each other, the second side surface WM-S4 of the window WM may have a first surface roughness, the third side surface POL-S4 of the polarization layer POL may have a second surface roughness, the first side surface DP-S4 of the display panel DP may have a third surface roughness, and the fourth side surface PM-S4 of the protection film PM may have a fourth surface roughness. Such surfaces roughnesses may be provided or be the result of the laser LR continuously provided at one or more intensities during the laser process of FIG. 5A.

The afore-described surface roughness may be measured, based on the standards ISO 1302:1992. The table below provides equivalent values for surface roughness (Ra) in micrometers (μm) and micro inch (μin), and corresponding N grade.

TABLE 1

| Surface Roughness (Ra) | | |
|---|---|---|
| μm | μin | Roughness Number |
| 50 | 2000 | N12 |
| 20 | 1000 | N11 |
| 12.5 | 500 | N10 |
| 6.3 | 250 | N9 |
| 3.2 | 125 | N8 |
| 1.6 | 63 | N7 |
| 0.8 | 32 | N6 |
| 0.4 | 26 | N5 |
| 0.2 | 8 | N4 |
| 0.1 | 4 | N3 |
| 0.05 | 2 | N2 |
| 0.025 | 1 | N1 |

According to an embodiment of the invention, the first to fourth surface roughnesses may be substantially the same. In this case, the laser LR with a constant intensity may be continuously provided during the laser process of FIG. 5A.

According to another embodiment of the invention, the first to fourth surface roughnesses may be different from each other. In this case, the laser LR with different intensities may be continuously provided to respective elements, during the laser process of FIG. 5A.

Figure 8A:
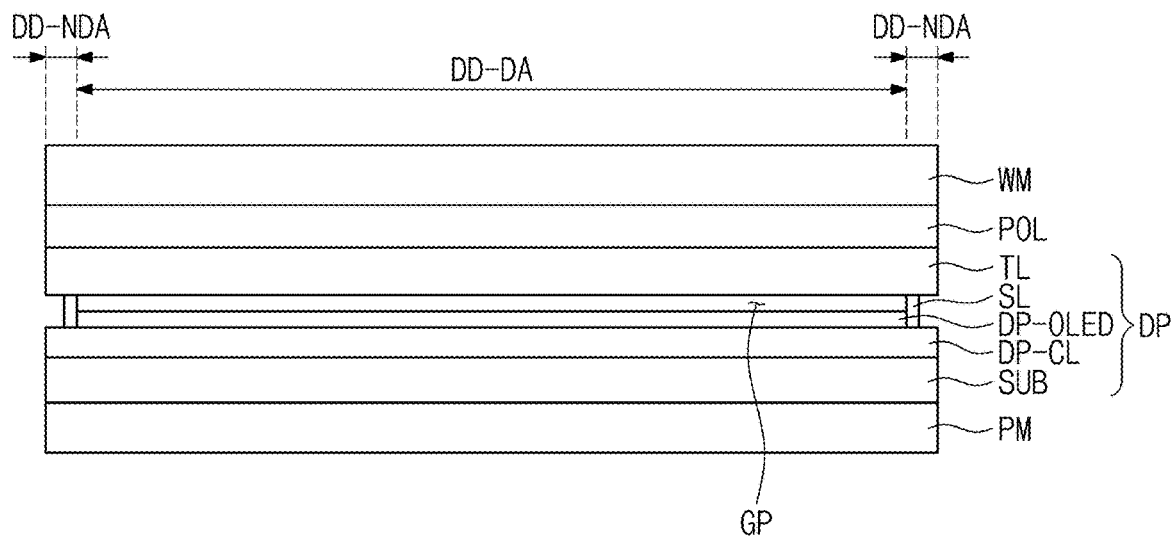
FIG. 8A is a cross-sectional view illustrating another embodiment of a display device.
Figure 8B:
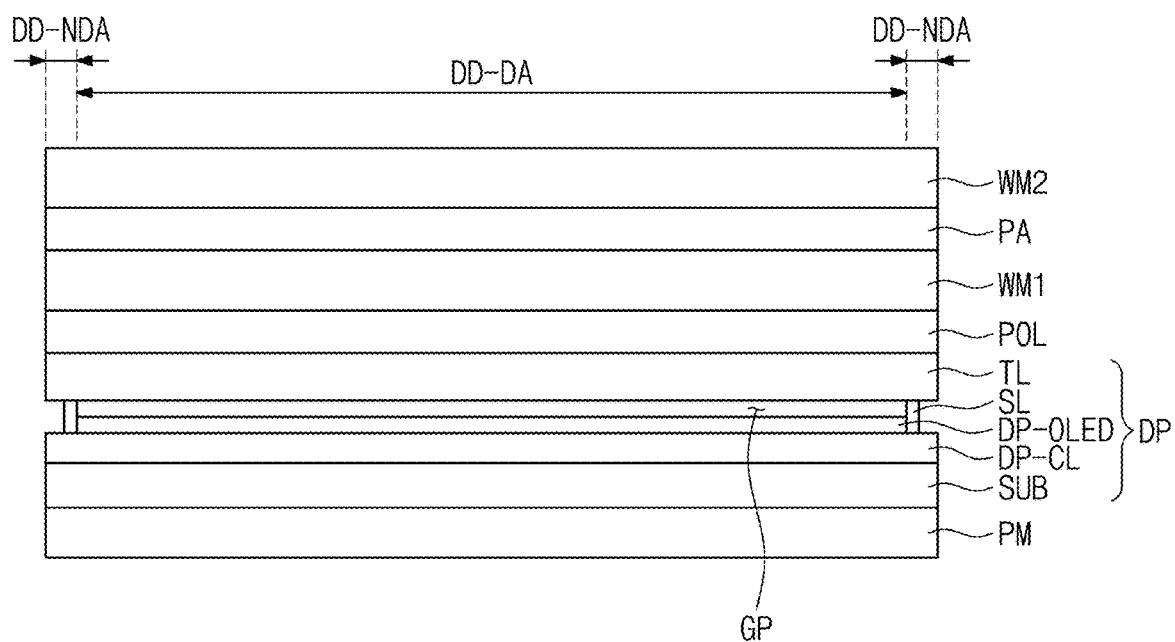
FIG. 8B is a cross-sectional view illustrating still another exemplary embodiment of a display device.

FIG. 8A is a cross-sectional view illustrating another embodiment of a display device. FIG. 8B is a cross-sectional view illustrating still another embodiment of a display device.

Referring to FIG. 8A, the display device DD may include the display region DD-DA and the non-display region DD-NDA described with reference to FIG. 1A.

According to a conventional display device, where the cutting region CA of the stacked structure of the preliminary display device shown in FIG. 5A is not removed, the non-display region DD-NDA may have a planar area larger than the non-display region DD-NDA of the display device DD according to one or more embodiment of the invention. In detail, for the display device DD according to one or more embodiment of the invention, an overall size (e.g., a total planar area) of the non-display region DD-NDA may be reduced, because the cutting region CA is removed from the stacked structure of the preliminary display device. Thus, the display device DD, which is formed from the stacked structure of the preliminary display device by the afore-described fabrication method, may have a relatively small non-display region DD-NDA (e.g., a slim bezel), because the corresponding ends of respective side surfaces of the window WM, the polarization layer POL, the display panel DP, and the protection film PM are aligned with each other along the thickness direction (e.g., third direction DR3). In an embodiment, for example, a planar area of the display region DD-DA relative to a total area of the display device DD (e.g., a total area of the display surface DD-IS) may be enlarged owing to removal of the cutting region CA from the stacked structure of the preliminary display device.

Referring again to FIG. 8A, the display device DD may include the base layer SUB, the circuit device layer DP-CL, the display device layer DP-OLED, and the encapsulation substrate TL described with reference to FIG. 2C. A sealing element SL may be disposed between the encapsulation substrate TL and the base layer SUB to enclose the display device layer DP-OLED.

In an embodiment, the base layer SUB and the encapsulation substrate TL may include ends at respective side surface, which are aligned with each other such as by the laser process described with reference to FIG. 5A, with the sealing element SL therebetween. However, the invention is not limited to this example, and in an embodiment, the encapsulation substrate TL may be disposed on the base layer SUB to cover the display device layer DP-OLED. In this case, the sealing element SL may be omitted.

Referring to FIG. 8B, unlike the structure of the window WM shown in FIG. 8A, the display device DD may include the first window portion WM1 and the second window portion WM2 disposed on the polarization layer POL described with reference to FIG. 7. The adhesive layer PA may be disposed between the first window portion WM1 and the second window portion WM2. The adhesive layer PA may be an optically clear adhesive ("OCA") film, an optically clear resin ("OCR") film, or a pressure sensitive adhesive ("PSA") film.

In an embodiment, the first window portion WM1 and the second window portion WM2 may include ends at respective side surfaces, which are aligned with each other such as by the laser process described with reference to FIG. 5A. In an embodiment, for example, the ends at respective side surfaces of the first window portion WM1 may be aligned with ends of corresponding side surfaces of the second window portion WM2. Furthermore, the aligned ends at respective side surfaces of the first and second window portions WM1 and WM2 may be aligned with corresponding ones of the third side surfaces of the polarization layer POL.

Figure 9:
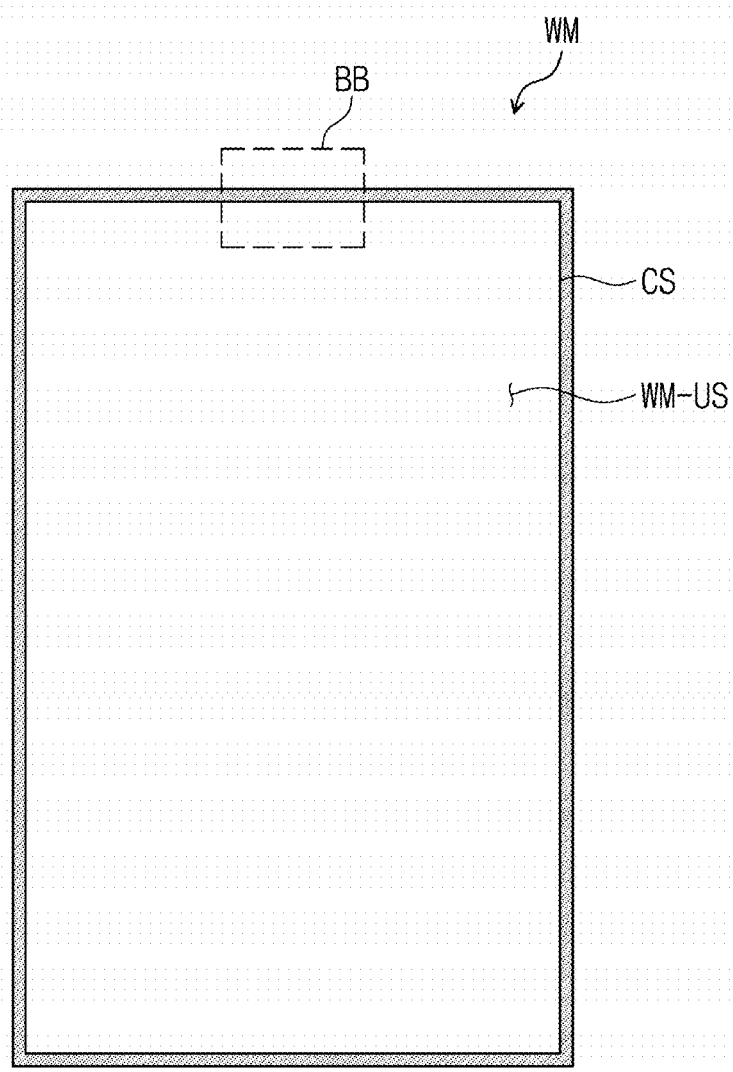
FIG. 9 is a top plan view illustrating an embodiment of a window.
Figure 10:
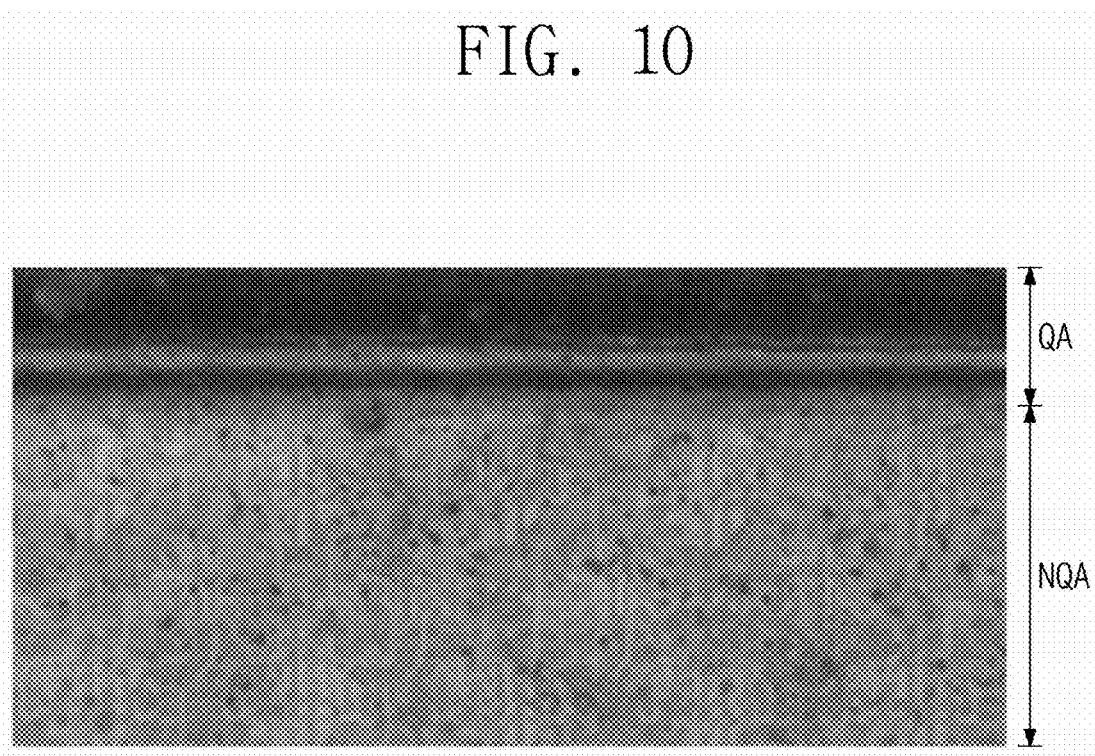
FIG. 10 is an enlarged view illustrating portion 'BB' of FIG. 9.

FIG. 9 is a top plan view illustrating an embodiment of a window WM. FIG. 10 is an enlarged top plan view illustrating portion 'BB' of FIG. 9.

FIG. 9 illustrates a top surface WM-US of the window WM. In an embodiment, a carbide portion CS may be disposed adjacent to an outer edge of the top surface WM-US of the window WM. The carbide portion CS disposed at the top surface WM-US of the window WM may be formed during the process of cutting each element layer using the laser LR of FIG. 5A.

Referring to FIG. 10, the top surface WM-US of the window WM may be divided into a carbonized region QA, in which carbide of the carbide portion CS is contained, and a non-carbonized region NQA, which is adjacent to the carbonized region QA and does not contain the carbide.

As shown in FIG. 10, the carbonized region QA may include a first region which has a black color (e.g., darker shade in FIG. 10 indicating more carbide than in a second region), and the second region which is adjacent to the first region and has a yellow color (e.g., lighter shade in FIG. 10 indicating less carbide than in the first region). During the process of cutting the window WM in preliminary form, by using the laser LR of FIG. 5A, an intensity of the laser LR at the first region is higher than an intensity of the laser LR at the second region, such that a thermal deformation effect may be greater at the first region than at the second region.

As described above, in the display device DD according to one or more embodiment of the invention, corresponding edges of the window WM, the polarization layer POL, the display panel DP, and the protection film PM may be aligned with each other, at one or more sides of the display device DD. Thus, minimizing a bezel or non-display region DD-NDA (e.g., a slim bezel region) is possible.

In addition, according to one or more embodiment of the invention, the display device DD is illustrated to have the display surface DD-IS of a rectangular shape with linear corners at which adjacent side surfaces meet each other, but the shape of the display surface DD-IS is not limited to this example and may be variously changed. As an example, at least one corner of the display device DD may be provided to have a curved shape in the top plan view. Such a curved corner of the display device DD may also be provided or formed by using the afore-described laser process.

According to one or more embodiment of the invention, corresponding side surfaces of a window WM, a polarization layer POL, a display panel DP, and a protection film PM may be aligned with each other by a continuous laser process and may provide a single side surface of the display device DD. In particular, since the corresponding side surfaces of the window WM, the polarization layer POL, the display panel DP, and the protection film PM are aligned with each other, a total planar area of a non-display region DD-NDA of the display device DD may be reduced.

Thus, the display device DD, which is provided or formed by the afore-described fabrication method, may have a slim non-display region DD-NDA (e.g., a slim bezel), because the corresponding side surfaces of the window WM, the polarization layer POL, the display panel DP, and the protection film PM are aligned with each other.

While example embodiments of the invention have been particularly shown and described, it will be understood by one of ordinary skill in the art that variations in form and detail may be made therein without departing from the spirit and scope of the attached claims.

What is claimed is:

1. A display device, comprising:
   a window;
   a display panel disposed below the window, the display panel comprising:
      a flat portion corresponding to a display area, and
      a bending portion extending from the flat portion and at which the display panel is bendable;
   a circuit substrate connected to the display panel at the bending portion; and
   a protection film disposed facing the window with the display panel therebetween,
   wherein
   each of the window and the display panel comprises a first side surface and a plurality of remaining side surfaces except for the first side surface,
   the first side surface of the display panel corresponds to the bending portion, and
   the remaining side surfaces of the window and the remaining side surfaces of the display panel are respectively aligned with each other.

2. The display device of claim 1, further comprising a polarization layer disposed between the window and the display panel,
   wherein a total planar area of the polarization layer is equal to a total planar area of the window and a total planar area of the flat portion.

3. The display device of claim 2, wherein
   the polarization layer comprises a first side surface corresponding to the bending portion and to the first side surface of each of the window and the display panel, and remaining side surfaces except for the first side surface of the polarization layer, and
   the remaining side surfaces of the window and the remaining side surfaces of the polarization layer are respectively aligned with each other.

4. The display device of claim 1, wherein each of the remaining side surfaces of the window and the remaining side surfaces of the display panel which are respectively aligned with each other are parallel to a thickness direction of the display panel.

5. The display device of claim 1, wherein
the protection film is disconnected at the bending portion, and
the protection film comprises:
   a first protection portion corresponding to the flat portion, and
   a second protection portion which is spaced apart from the first protection portion and corresponds to the bending portion.

6. The display device of claim 5, wherein
the first protection portion comprises a first side surface corresponding to the bending portion and to the first side surface of each of the window and the display panel, and remaining side surfaces except for the first side surface of the first protection portion, and
the remaining side surfaces of the first protection portion and the remaining side surfaces of the display panel are respectively aligned with each other.

7. The display device of claim 5, wherein
the bending portion comprises a first portion at which the first side surface of the display panel is defined and a second portion which connects the flat portion to the first portion, and
the first portion overlaps the flat portion and the second portion which is bent does not overlap the flat portion.

8. The display device of claim 1, wherein
a top surface of the window comprises carbide along each of the first side surface of the window and the remaining side surfaces of the window.

9. The display device of claim 1, wherein along a thickness direction of the display panel, the window comprises:
   a first window portion disposed on the display panel;
   a second window portion disposed on the first window portion; and
   an adhesive layer disposed between the first window portion and the second window portion.

10. A display device, comprising:
   a display panel including:
      a display area at which an image is displayed,
      a flat portion corresponding to the display area, and
      a bending portion extending from the flat portion and at which the display panel is bendable;
   a window through which the image from the display panel is viewable from outside the display device; and
   a protection film disposed facing the window with the display panel therebetween,
wherein
each of the window and the display panel comprises a first side surface and a plurality of remaining side surfaces except for the first side surface,
the first side surface of the display panel corresponds to the bending portion, and
the remaining side surfaces of the window and the remaining side surfaces of the display panel are respectively aligned with each other.

11. The display device of claim 10, further comprising a polarization layer disposed between the window and the display panel,
wherein
the polarization layer comprises a first side surface corresponding to the bending portion and to the first side surface of each of the window and the display panel, and remaining side surfaces except for the first side surface of the polarization layer, and
the remaining side surfaces of the window and the remaining side surfaces of the polarization layer are respectively aligned with each other.

12. The display device of claim 11, wherein a total planar area of the polarization layer is equal to a total planar area of the window, in a top plan view.

13. The display device of claim 10, wherein
the protection film comprises a first side surface corresponding to the bending portion and to the first side surface of each of the window and the display panel, and remaining side surfaces except for the first side surface of the protection film, and
the remaining side surfaces of the window and the remaining side surfaces of the protection film are respectively aligned with each other.

14. The display device of claim 13, wherein a total planar area of the protection film is equal to a total planar area of the window, in a top plan view.

15. The display device of claim 10, wherein at a same side of the display device, the remaining side surfaces of the window and the display panel have surface roughnesses different from each other.

16. The display device of claim 10, wherein each of the remaining side surfaces of the window and the remaining side surfaces of the display panel which are respectively aligned with each other are parallel to a thickness direction of the display panel.

17. The display device of claim 10, further comprising a circuit substrate connected to the display panel at the bending portion,
wherein a portion of the bending portion overlaps the flat portion along a thickness direction of the display panel.

18. A display device, comprising:
   a window through which an image is viewable from outside the display device;
   a display panel from which the image is provided to the window;
   a polarization layer disposed between the window and the display panel; and
   a protection film facing the window with the display panel and the polarization layer therebetween,
wherein a total planar area of the window is equal to a total planar area of the polarization layer, in a top plan view.

19. The display device of claim 18, wherein a total planar area of the display panel is equal to the total planar area of the window.

20. The display device of claim 18, wherein in the top plan view, at least three side surfaces of the display panel are respectively aligned with corresponding three side surfaces of the window.

* * * * *